April 30, 1968 D. M. BARTON ET AL 3,381,238

SIGNAL ISOLATION CIRCUIT

Filed June 29, 1964 2 Sheets-Sheet 1

DAVID M. BARTON
GEORGE E. SMITH
INVENTORS

BY
BUCKHORN, BLORE, KLARQUIST & SPARKMAN
ATTORNEYS

SIGNAL ISOLATION CIRCUIT

Filed June 29, 1964 2 Sheets-Sheet 2

DAVID M. BARTON
GEORGE E. SMITH
INVENTORS.

BY
BUCKHORN, BLORE, KLARQUIST & SPARKMAN
ATTORNEYS

United States Patent Office 3,381,238

Patented Apr. 30, 1968

3,381,238

SIGNAL ISOLATION CIRCUIT

David M. Barton and George E. Smith, Portland, Oreg., assignors to Tektronix, Inc., Beaverton, Oreg., a corporation of Oregon Filed June 29, 1964, Ser. No. 378,636
9 Claims. (Cl. 330—165)

ABSTRACT OF THE DISCLOSURE

Amplifier circuits of wide band frequency response are described having two ground leads directly connected to the common electrode of the amplifier tube or transistor to provide two separate current paths between such common electrode and ground, and a bifilar transformer formed by one of the ground leads with either the input lead or the output lead to isolate the input and output circuits of the amplifier. As a result the input current coupled to the common electrode through the stray interelectrode capacitance, flows to ground through a different one of the current paths than does the output current to prevent the common electrode lead inductance from reducing the effective input signal at high frequencies.

The subject matter of the present invention relates generally to signal isolation in electrical circuits, and in particular to amplifiers employing transformers for isolation of their input and output circuits to prevent the lead inductance of the common or ground electrode in an electrical signal translating device of the amplifier from producing a loading effect which reduces the effective input signal of such signal translating device at high frequencies.

The signal isolation circuit of the present invention is especially useful when employed in D.C. coupled amplifiers of wide frequency bandwidth of the types which are used as the vertical amplifiers of cathode ray oscilloscopes. For example, the present isolation circuit can be employed in the distributed amplifier of U.S. Patent 2,930,986 which was issued Mar. 29, 1960 to John R. Kobbe et al. However, the signal isolation technique of the present invention may be employed in other circuits including oscillators and switching circuits.

Briefly one embodiment of an amplifier in accordance with the present invention includes a vacuum tube connected as a grounded cathode amplifier. The cathode of such vacuum tube is directly connected to a pair of leads which provide two separate current paths between such cathode and ground. One of the cathode leads is passed through a magnetic core before being connected to ground, and the input lead connected to the grid of the tube is also passed through such magnetic core before being connected to the input terminal of the amplifier. As a result, such grid lead forms the primary winding, and such cathode lead forms the secondary winding of a bifilar transformer.

At high frequencies the input signal applied to the grid of the tube is capacitively coupled to the cathode of such tube by the stray grid to cathode capacitance of the tube so that in conventional common cathode amplifiers such input signal would flow through the same cathode lead as the output signal. The input signal transmitted to the cathode in previous amplifiers produces a voltage on such cathode due to the inductance of the single cathode lead. The current in the cathode lead is the sum of the output current $i_2$ and the input current $i_1$ in the grid to cathode capacitance C. These two currents are 90 degrees out of phase for sinusoidal A.C. input signals due to this capacitance. As a result of the finite cathode lead inductance L, the actual grid to ground input voltage $e_g$ is not the same as the grid to cathode voltage $e_g-e_k$ and is not 90 degrees out of phase with the input current. Thus, there is a component of input current in phase with the input voltage, which means that a resistance appears to be in series between the grid and the input signal source. Since $i_2=G_m\ (e_g-e_k)$ where $G_m$ is the mutual conductance of the tube, $i_j=jWC\ (e_g-e_k)$, and $e_g=e_k+(e_g-e_k)$, it follows that $e_g=jWL(i_2+i_1)+(e_g-e_k)$, which by substitution is $e_g=(e_g-e_k)(1+jWLG_m+jWC)$. Considering now the input impedance $Z_1$ of the amplifier we have $$Z_1=\frac{eg}{i_1}=\frac{jWL(G_m+jWC_g}{jWC}+1$$

or $$Z_1=jWL+\frac{LG_m}{C}+\frac{1}{jWC}$$

Thus, we see that the input impedance is equivalent to a simple series circuit consisting of an inductor, a resistor and a capacitor with fixed values. The resistive component of such input impedance is given by the expression $$\frac{L}{C}=G_m$$

The voltage produced across the resistive component of the input impedance operates as a degenerative feedback to reduce the effective grid to cathode input signal voltage so that it decreases the high frequency response of the amplifier. This is prevented in one embodiment of the common cathode amplifier of the present invention by the bifilar transformer formed by the magnetic core surrounding the grid lead and the second cathode lead of such amplifier, which provides two separate current paths to ground for the input signal and the output signal flowing to the cathode.

The amplifiers of the present invention have advantages over conventional amplifiers including the higher frequency response mentioned previously. This increase in frequency response is obtained in a simple and inexpensive manner merely by connecting the primary winding of a bifilar transformer in series with the input lead or the output lead of the signal translating device of the amplifier and by connecting the secondary winding of such transformer with one of a pair of common leads of such device. While a separate transformer may be employed, the use of a small toroid of ferrite material as a magnetic core about the input lead or the output lead and one of the common leads, appears to be the most practical way of providing such transformer. However, it is also possible to provide the necessary transformer coupling without the use of a magnetic core merely by twisting together the two leads used as the windings of the transformer to provide sufficient magnetic coupling between such leads to form a bifilar transformer having an air core. Since the primary and secondary windings of the transformer also act as a transmission line for high frequency input signals, the transformer is constructed to provide the transmission line with a characteristic impedance approximately equal to that of the impedance of the source of such input signals so that such source impedance absorbs signal reflections in such line to prevent signal distortion.

It is therefore one object of the present invention to provide an electrical circuit whose input and output circuits are isolated from each other.

Another object of the invention is to provide an improved amplifier circuit having signal isolation circuits of simple and inexpensive construction to provide the amplifier with a greater high frequency response and to prevent the transmission of signals from the output to the input of such amplifier.

A further object of the present invention is to provide an improved D.C. coupled amplifier circuit employing a transformer to prevent the loading effect of the lead inductance of the common electrode of a signal translating device employed in such amplifier.

An additional object of the present invention is to provide an improved amplifier of better high frequency response in which a core of magnetic material is employed around the input lead or output lead of a vacuum tube or transistor in such amplifier and one of a pair of common leads connecting the common electrode of such tube or transistor to ground.

Still another object of the present invention is to provide an improved amplifier circuit of greater high frequency response by employing a bifilar transformer to provide two separate current paths to ground for the input and output signals of such amplifier.

Other objects and advantages of the present invention will be apparent in the following detailed descriptions of certain preferred embodiments thereof and from the attached drawings of which:

Figure 1:
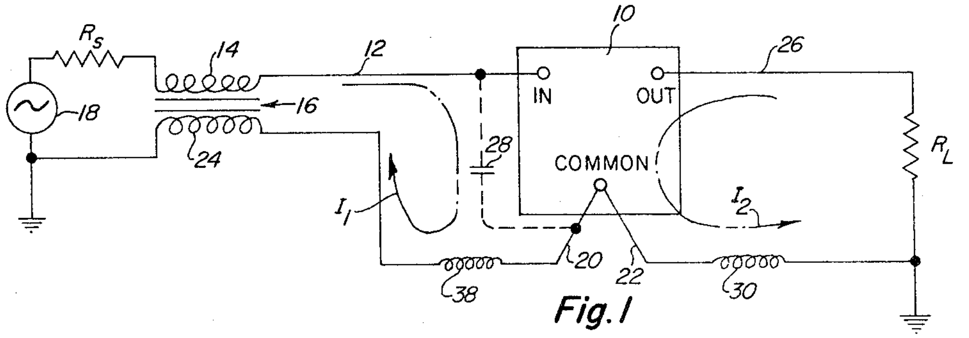
FIG. 1 is a schematic diagram of the A.C. equivalent circuit of an amplifier circuit in accordance with the present invention employing a transformer in its input stage.
Figure 2:
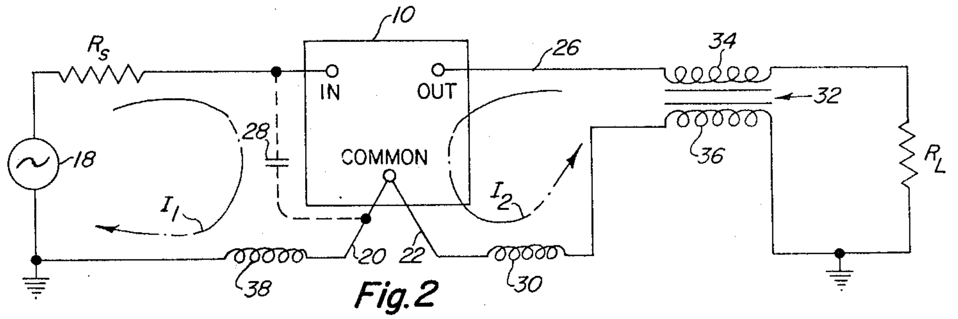
FIG. 2 is an A.C. equivalent circuit of another embodiment of the amplifier circuit of the present invention employing a transformer in its output circuit.

The principle of the lead inductance compensation technique of the present invention is best understood by referring to the A.C. equivalent circuits of FIGS. 1 and 2 which include electrical signal translating device 10 shown in the form of a box having three terminals labeled "IN," "OUT" and "COMMON" which are connected respectively to the input electrode, the output electrode and the ground or common electrode of such device. These signal translating devices may be vacuum tubes connected as common cathode amplifiers, cathode follower amplifiers or common grid amplifiers; or such signal translating devices may be transistors connected as common emitter amplifiers, emitter follower amplifiers, or common base amplifiers. In FIG. 1 the input electrode of the signal translating device 10 is connected by an input lead 12 to one terminal of a primary winding 14 on a transformer 16, whose other terminal is connected to a source 18 of input signals through the internal resistance $R_S$ of such source. The common electrode is directly connected to a pair of common or ground leads 20 and 22 which provide two separate current paths between such common electrode and ground, and the secondary winding 24 of transformer 16 is connected in series with lead 20. The primary winding 14 and the secondary winding 24 are wound in the same direction with an equal number of turns about a core of magnetic material to provide a bifilar transformer. Thus, signal current flowing in one direction through one of the windings will immediately induce an equal and opposite current in the other winding. The output electrode of the signal translating device 10 is connected through an output lead 26 to one terminal of a load resistor $R_L$ whose other terminal is grounded.

Input signals of high frequency applied to input lead 12 are transmitted through the stray capacitance 28 existing between the input electrode and the common electrode of the signal translating device. If transformer 16, and common lead 20 were not employed in the amplifier circuit of FIG. 1, which is true of a conventional amplifier, the input signal current transmitted to the common electrode through stray capacitance 28 would flow through common lead 22 to ground so that it would induce a voltage in the inductance 30 of such common lead. The output signal current $I_2$ flowing in output lead 26 is transmitted through the signal translating device 10 to the common electrode so that such output signal current also flows through the common lead inductance 30. As a result of this common current path, the voltage drop produced across the lead inductance 30 would cause a component of input current to be in phase with the input voltage. The ratio of such input voltage to such in phase input current can be expressed as an equivalent resistance of $L/C\ G_m$ for a common cathode amplifier where L is the lead inductance 30, C is the stray capacitance 28, and $G_m$ is the mutual conductance of the vacuum tube 10. As a result, in previous amplifier circuits the voltage on the common or ground electrode increased at the same time the input signal voltage on the input electrode increased, which resulted in a reduction of the signal voltage difference between the input electrode and the ground electrode so that the signal translating device saw less effective input signal voltage. Thus, the presence of the stray capacitance 28 and the single lead inductance 30 combined in previous amplifiers to provide negative voltage feedback which reduced the input signal of the signal translating device at high frequencies.

The circuit of the present invention shown in FIG. 1 prevents this from happening by employing the second common lead 20 and the bifilar transformer 16 in order to provide two separate current paths for the input signal current $I_1$ and for the output signal $I_2$. The input signal current flowing in input lead 12 and primary winding 14 induces an equal and opposite current in the secondary winding 24 of the bifilar transformer so that substantially all of the input signal current transmitted through stray capacitance 28 to the common electrode flows through common lead 20 to ground and substantially none of such input signal current flows through common lead 22. In addition, substantially all of the output signal current flowing from output lead 26 to the common electrode is transmitted to ground through the common lead 22 because the transformer 16 appears as a high impedance for any output signal current which tends to flow through common lead 20. Thus, any output signal current which flows in the secondary winding 24 induces an equal and opposite current in the primary winding 14 which can only be transmitted to ground through the shunt capacitance (not shown) produced between the input electrode of the signal translating device and ground. As a result, the equivalent series resistance $L/C\ G_m$ is eliminated along with the reduction in input signal caused by the voltage drop across such resistance.

A similar result may be accomplished by employing a transformer 32 in the output circuit of the signal translating device as shown in FIG. 2, in place of the transformer 16 of FIG. 1. Except for the movement of the transformer from the input circuit to the output circuit, the amplifier of FIG. 2 is similar to that in FIG. 1 so that the same reference numerals and designations have been used to identify similar components. The output lead 26 is connected to one terminal of a primary winding 34 of the transformer 32, and the other terminal of such primary winding is connected to load resistor $R_L$. Common lead 20 is connected directly to ground while common lead 22 is connected to one terminal of the secondary winding 36 of transformer 32, and the other terminal of such secondary winding is connected to ground. Of course the two ground leads 20 and 22 are both directly connected to the common electrode of the signal translating device 10 and are connected together by such common electrode in FIGS. 1 and 2. Transformer 32 is a bifilar transformer similar to transformer 16 of FIG. 1 so that output signal current $I_2$ flowing in the primary winding causes an equal current to flow in the opposite direction through the secondary winding. This means that the output signal current $I_2$ flowing from output lead 26 to the common electrode is transmitted to ground through the common lead 22, rather than through common lead 20. However, the input signal current $I_1$ flowing in input lead 12 and transmitted through the stray capacitance 28, is transmitted to ground through the other common lead 20 because the transformer 32 appears as a high impedance to such input signal current. If the input signal current tended to flow through the other common lead 22 and through the secondary winding 36 of transformer 32, it would induce an equal and opposite current in the primary winding 34 which would be extremely small due to the fact that such current must flow through output impedance of the signal translating device. For this reason, very little input signal current flows through common lead 22. Thus, the transformer 32 in the amplifier circuit of FIG. 2 also provides two separate current paths for the input signal current and the output signal current to prevent the lead inductance of the common electrode leads 20 and 22 from reducing the effective input signal of the signal translating device. It should be noted that in both of the equivalent circuits of FIGS. 1 and 2, while the input signal current flows through the inductance 38 of common lead 20, this does not cause the large resistive voltage drop that is produced across the equivalent series resistance when the input signal current and the output signal current flow through the same lead inductance.

Figure 3A:
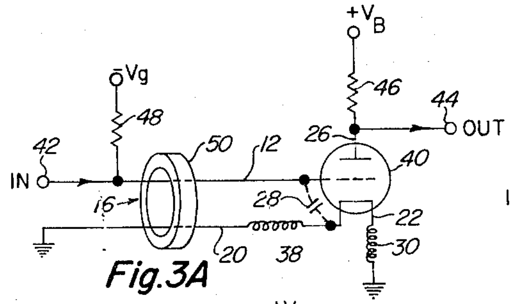
FIGS. 3A and 3B show grounded cathode amplifiers made in accordance with FIGS. 1 and 2 respectively.

One embodiment of a specific amplifier circuit of the present invention made in accordance with the equivalent circuit of FIG. 1 is a common cathode amplifier shown in FIG. 3A which includes a vacuum tube 40 whose grid is connected through input lead 12 to a signal input terminal 42. The anode of tube 14 is connected through output lead 26 to a signal output terminal 44 and to a source of positive D.C. supply voltage $+V_B$ through a load resistor 46. The input lead is connected to a source of negative D.C. bias voltage $-V_g$ through a bias resistor 48 so that the tube is normally biased conducting to enable the amplifier circuit to operate as a class "A" amplifier. The cathode of the tube 40 is connected to ground by the pair of parallel common leads 20 and 22. A magnetic core 50 of ferrite or other suitable magnetic material in the form of an annular ring or toroid is positioned around the input lead 12 and the common cathode lead 20 to provide the transformer 16. Thus, the input lead passes through the magnetic core in the same direction as the cathode lead 20 before such leads are connected to the tube 40 so that such input lead forms a single turn primary winding, and such cathode lead forms a single turn secondary winding of a bifilar transformer.

It should be noted that the input lead 12 and the common cathode lead 20 may be provided with several turns of equal number about the magnetic core 50 before being connected to the tube, or a separate bifilar transformer may be connected to such leads if it is so desired. Also, the magnetic core 50 may be entirely eliminated, and the input lead 12 and the cathode lead 20 twisted closely together and coiled in such a manner as to provide sufficient magnetic coupling so that they form a bifilar transformer having an air core. The grounded cathode amplifier of FIG. 3A operates in a similar manner to a conventional grounded cathode amplifier except that the bifilar transformer 16 provides separate current paths to ground for the input signal and the output signal.

Figure 3B:
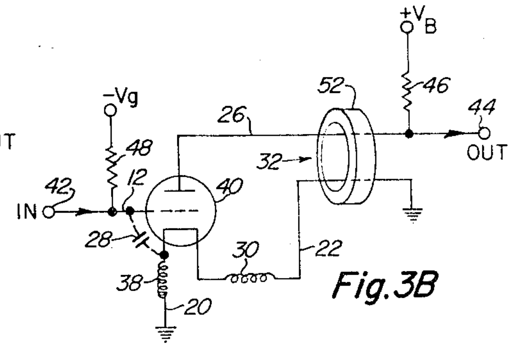

The grounded cathode amplifier of FIG. 3B is similar to that of FIG. 3A except that the magnetic core 50 has been replaced by another magnetic core 52 of similar type surrounding the output lead 26 and the other cathode lead 22 to form a transformer 32 which functions in a manner described above with reference to FIG. 2.

Figure 4A:
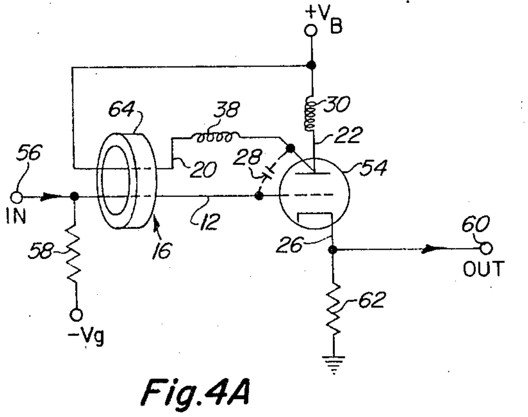
FIGS. 4A and 4B show cathode follower amplifiers made in accordance with FIGS. 1 and 2 respectively.
Figure 4B:
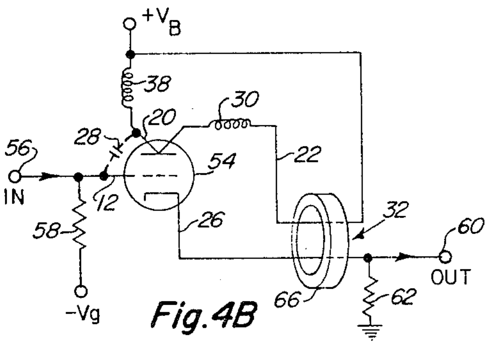

The isolation circuit of the present invention can also be employed in the cathode follower amplifiers of FIGS. 4A and 4B. Thus, the cathode follower amplifier of FIG. 4A includes a vacuum tube 54 whose grid is connected to an input terminal 56 through input lead 12 and to a source of negative D.C. bias voltage $-V_g$ through a bias resistor 58. The cathode of such tube is connected through output lead 26 to an output terminal 60 and to one terminal of a load resistor 62 whose other terminal is grounded. Since the anode of the cathode follower tube 54 is the common electrode, it is provided with a pair of leads 20 and 22 which are connected to A.C. ground at a source of positive D.C. bias voltage $V_B$. Common anode lead 20 is passed through a magnetic core 64 before being connected to such D.C. source so that it forms the secondary winding of transformer 16, and input lead 12 is similarly passed through the magnetic core 64 to form the primary winding of such transformer. As a result, the cathode follower amplifier of FIG. 4A operates in a similar manner to a conventional cathode follower except for transformer 16 which functions in a similar manner as in the equivalent circuit of FIG. 1.

The cathode follower circuit of FIG. 4B is similar to that of FIG. 4B except that the magnetic core 64 is replaced by another magnetic core 66 which is positioned about the output lead 26 and the other common anode lead 22 to provide a bifilar transformer 32 similar to that of FIG. 2.

Figures 5A, 5B, 6A, 6B, 7A, 7B, 8A, 8B:
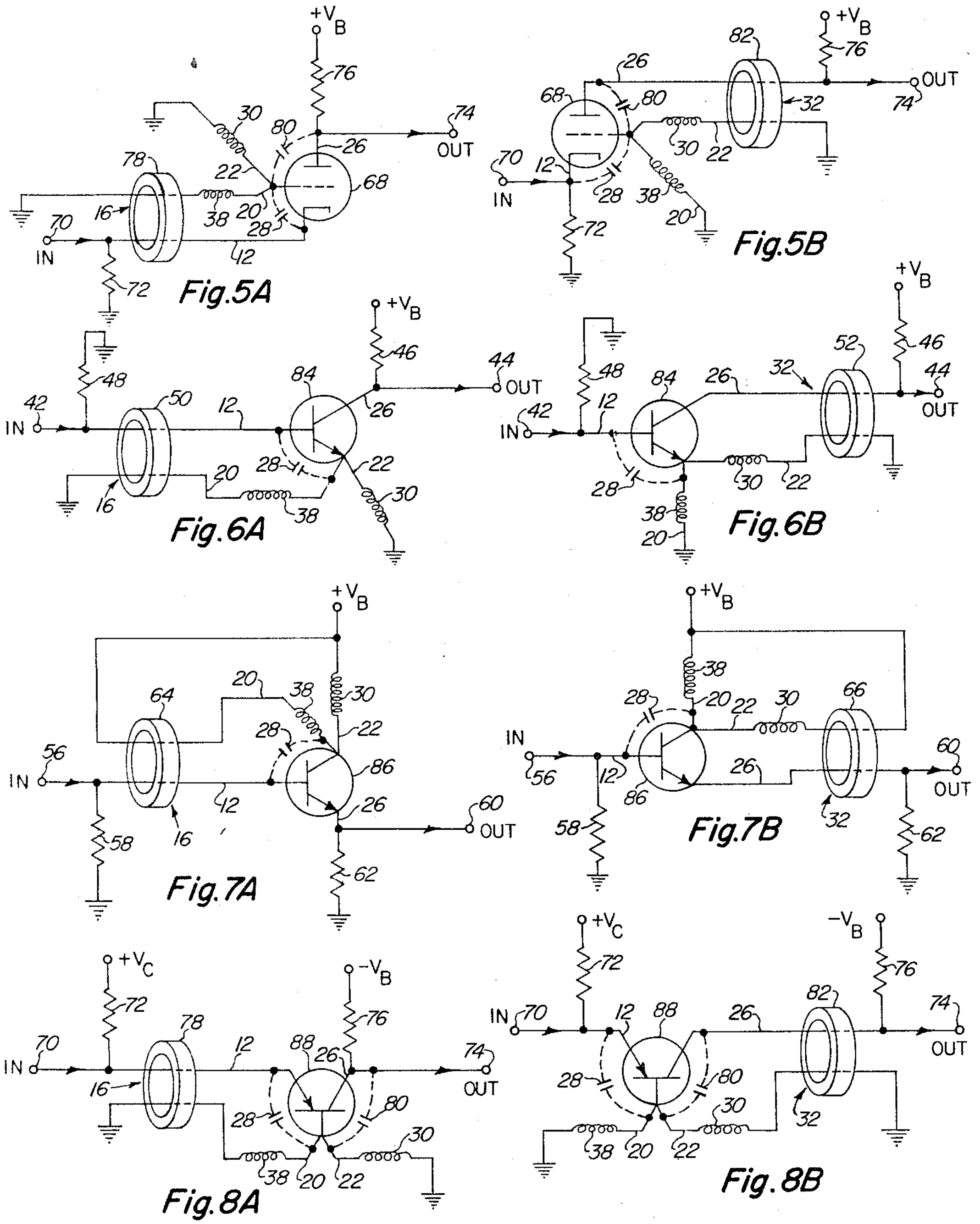
FIGS. 5A and 5B show grounded grid amplifiers made in accordance with FIGS. 1 and 2 respectively.
FIGS. 6A and 6B show common emitter amplifiers made in accordance with FIGS. 1 and 2 respectively.
FIGS. 7A and 7B show emitter follower amplifiers made in accordance with FIGS. 1 and 2 respectively.
FIGS. 8A and 8B show common base amplifiers made in accordance with FIGS. 1 and 2 respectively.

In addition, the isolation circuit of the present invention may also be employed in the grounded grid amplifiers of FIGS. 5A and 5B. Thus, the amplifier circuit of FIG. 5A includes a vacuum tube 68 whose cathode is connected through the input lead 12 to an input terminal 70 and to ground through a bias resistor 72. The anode of such tube is connected through the output lead 26 to an output terminal 74 and to a source of positive D.C. supply voltage through a load resistor 76. The grid of a grounded grid tube 68 is the common electrode, and is connected to ground through the pair of common leads 20 and 22. Grid lead 20 is passed through a magnetic core 78 before being grounded, to form the primary winding of a bifilar transformer 16. The cathode input lead 12 is also passed through the magnetic core 78 to form the primary winding of such transformer so that the grounded grid amplifier of FIG. 5A operates in a similar manner to the equivalent circuit of FIG. 1. It should be noted that the output signal transmitted through output lead 26 is capacitively coupled to the grid of tube 68 by the stray capacitance 80 between the grid and at the anode of such tube. Thus, in previous grounded grid amplifier circuits, the input and output signal currents flow through the same grid lead inductance at high frequencies to decrease in the effective input signal voltage produced between the grid and cathode of such tube.

The grounded grid amplifier of FIG. 5B is similar to that of FIG. 5A except that the magnetic core 78 has been replaced by another magnetic core 82 around the output lead 26 and the grid lead 22 to provide a bifilar transformer 32 similar to that shown in the equivalent circuit of FIG. 2.

The signal isolation circuit of the present invention may be employed in transistor amplifiers, as well as vaccum tube amplifiers. Thus, the common emitter amplifiers shown in FIGS. 6A and 6B are similar to the common cathode amplifiers of FIGS. 3A and 3B, respectively, except that the vacuum tubes 40 have been replaced with transistors 84 of an NPN type, and the base emitter and collector electrodes of such transistors are connected in a similar manner to the grid, cathode and anode electrodes of such tubes. Of course, PNP type transistors can be employed in place of the NPN type transistors shown merely by reversing the polarity of the D.C. supply voltage.

In a similar manner, the emitter follower amplifiers shown in FIGS. 7A and 7B are similar to the cathode followers of FIGS. 4A and 4B, respectively, except that the vacuum tubes 54 are replaced by transistors 86 of the NPN type shown, or of a PNP type (not shown).

In addition, the common base amplifiers shown in FIGS. 8A and 8B may be provided in a similar manner to the grounded grid amplifiers of FIGS. 5A and 5B merely by replacing the vacuum tubes 68 with transistors 88 of the PNP type shown, or of a NPN type (not shown).

It will be obvious to those having ordinary skill in the art that various changes may be made in the details of the above-described preferred embodiments to the present invention. For example, the signal isolation circuit of the present invention may be applied to a signal translating device in an oscillator or switching circuit in a similar manner to the amplifier circuits shown. Therefore, the scope of the present invention should only be determined by the following claims.

We claim:

1. A common cathode amplifier circuit comprising:

a vacuum tube having a cathode, an anode and a grid;

a load resistance having one terminal connected to said anode;

a source of D.C. supply voltage connected between said cathode and the other terminal of said load resistance;

an input signal lead connected between an input terminal and said grid;

an output signal lead connected between an output terminal and said anode;

a pair of seperate ground leads each having one end directly connected to said cathode to provide two separate current paths between said cathode and ground, said pair of ground leads being connected together only by said cathode at said one ends so that none of the lead inductance of said ground leads is common to both of said current paths;

and a core of magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuits of said tube.

2. A common emitter amplifier circuit comprising:

a transistor having an emitter, a collector and a base electrode;

a load resistance having one terminal connected to said collector;

a source of D.C. supply voltage connected between said emitter and the other terminal of said load resistance;

an input signal lead connected between an input terminal and said base;

an output signal lead connected between an output terminal and said collector;

a pair of separate ground leads each having one end directly connected to said emitter to provide two separate current paths between said emitter and ground, said pair of ground leads being connected together only by said emitter at said one ends so that none of the lead inductance of said ground leads is in common with both of said current paths;

and a core magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuit of said transistor.

3. A cathode follower amplifier circuit comprising:

a vacuum tube having a cathode, an anode and a grid;

a load resistance having one terminal connected to said cathode;

a source of D.C. supply voltage connected between said anode and the other terminal of said load resistance;

an input signal lead connected between an input terminal and said grid;

an output signal lead connected between an output terminal and said cathode;

a pair of separate ground leads each having one end directly connected to said anode to provide two separate current paths between said anode and A.C. ground, said pair of ground leads being connected together only by said anode at said one ends so that none of the lead inductance of said ground leads is in common with both of said current paths;

and a core of magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuits of said tube.

4. An emitter follower amplifier circuit comprising:

a transistor having an emitter, a collector and a base;

a load resistance having one terminal connected to said emitter;

a source of D.C. supply voltage connected between said collector and the other terminal of said load resistance;

an input signal lead connected between an input terminal and said base;

an output signal lead connected between an output terminal and said emitter;

a pair of separate ground leads each having one end directly connected to said collector to provide two separate current paths between said collector and ground, said pair of ground leads being connected together only by said collector at said one ends so that none of the lead inductance of said ground leads is in common with both of said current paths;

and a core of magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuits of said transistor.

5. A common grid amplifier circuit comprising:

a vacuum tube having a cathode, an anode and a grid;

a load resistance having one terminal connected to said anode;

a source of D.C. supply voltage connected between said cathode and the other terminal of said load resistance;

an input signal lead connected between an input terminal and said cathode;

an output signal lead connected between an output terminal and said anode;

a pair of separate ground leads each having one end directly connected to said grid to provide two separate current paths between said grid and ground, said pair of ground leads being connected together only by said grid at said one ends so that none of the lead inductance of said ground leads is in common with both of said current paths;

and a core of magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuits of said tube.

6. A common base amplifier circuit comprising:

a transistor having an emitter, a collector and a base;

a load resistance having one terminal connected to said collector;

a source of D.C. supply voltage connected between said emitter and the other terminal of said load resistance;

an input signal lead connected between an input terminal and said emitter;

an output signal lead connected between an output terminal and said collector;

a pair of separate ground leads each having one end directly connected to said base to provide two separate current paths between said base and ground, said pair of ground leads being connected together only by said base at said one ends so that none of the lead inductance of said ground leads is in common with both of said current paths;

and a core of magnetic material positioned around one of said signal leads and one of said ground leads to form a bifilar transformer having said one signal lead as its primary winding and said one ground lead as its secondary winding, so that said transformer has its primary winding connected in series with the signal lead and its secondary winding connected in series with the ground lead in the same one circuit of the input and output circuits of said transistor.

7. An electrical circuit comprising:

an electrical signal translating device having an input electrode an output electrode and a common electrode;

input circuit means for applying an input signal to said device, including an input signal conductor lead connecting said input electrode to an input terminal and a first ground conductor lead having one end connected directly to said common electrode and connecting said common electrode to ground through a first current path;

output circuit means for transmitting an output signal from said device, including an output signal conductor lead connecting said output electrode to an output terminal, and a second ground conductor lead having one end connected directly to said common electrode and connecting said common electrode to ground through a second current path, said first and second ground leads being connected together only by said common electrode at said one ends and said second current path being separate from said first current path so that none of the lead inductance of said first and second ground leads is in common with both said first and second current paths;

and isolation means, including a bifilar transformer connected in one of said inuput and output circuit means and having its primary winding in series with the signal conductor and its secondary winding in series with the ground conductor of said one circuit means, for causing substantially all of the input signal current transmitted to the common electrode to flow through said first current path and substantially all of the output signal current transmitted to said common electrode to flow through said second current path to isolate said input circuit means from said output circuit means and prevent any ground lead inductance from being in common with both of said circuit means.

8. An electrical circuit in accordance with claim 7 in which the circuit is an amplifier and the transformer is provided in the input circuit means with the primary winding connected between a source of input signals and the input electrode, and with the secondary winding connected between ground and the common electrode.

9. An electrical circuit in accordance with claim 7 in which the circuit is an amplifier and the transformer is provided in the output circuit means with the primary winding connerted between a load impedance and the output electrode, and the secondary winding connected between ground and the common electrode.

References Cited

UNITED STATES PATENTS

| | | | |
|---|---|---|---|
| 2,603,723 | 7/1952 | Thompson | 330—189 X |
| 3,154,750 | 10/1964 | David et al. | 330—195 X |
| 3,281,705 | 10/1966 | Frye | 330—126 X |

ROY LAKE, *Primary Examiner.*

NATHAN KAUFMAN, *Examiner.*